(12) United States Patent
Ho et al.

(10) Patent No.: US 7,445,963 B2
(45) Date of Patent: Nov. 4, 2008

(54) SEMICONDUCTOR PACKAGE HAVING AN INTERFACIAL ADHESIVE LAYER

(75) Inventors: Wen Seng Ho, Singapore (SG); Stephen Wai Ching Wong, Singapore (SG)

(73) Assignee: Infineon Technologies, AG, Munich (DE)

( * ) Notice: Subject to any disclaimer, the term of this patent is extended or adjusted under 35 U.S.C. 154(b) by 161 days.

(21) Appl. No.: 11/531,532

(22) Filed: Sep. 13, 2006

(65) Prior Publication Data

US 2007/0080434 A1   Apr. 12, 2007

Related U.S. Application Data

(63) Continuation of application No. PCT/IB2004/000990, filed on Mar. 16, 2004.

(51) Int. Cl.
 H01L 21/48 (2006.01)
 H01L 21/50 (2006.01)
 H01L 21/78 (2006.01)
(52) U.S. Cl. ............... 438/113; 438/118; 438/127; 438/464; 257/E21.499; 257/E21.503
(58) Field of Classification Search ......... 257/E21.499, 257/E21.502, E21.503, E21.511
See application file for complete search history.

(56) References Cited

U.S. PATENT DOCUMENTS

| | | | |
|---|---|---|---|
| 5,252,848 A | 10/1993 | Adler et al. | 257/328 |
| 5,883,430 A | 3/1999 | Johnson | 257/706 |
| 6,730,542 B2 * | 5/2004 | Wang et al. | 438/108 |
| 6,784,022 B2 * | 8/2004 | Umehara et al. | 438/111 |
| 6,873,060 B2 | 3/2005 | Blaszczak et al. | 257/787 |
| 6,896,760 B1 * | 5/2005 | Connell et al. | 156/249 |
| 6,919,262 B2 * | 7/2005 | Senoo et al. | 438/464 |
| 6,929,856 B2 * | 8/2005 | Ishikawa et al. | 428/355 RA |
| 6,943,061 B1 * | 9/2005 | Sirinorakul et al. | 438/113 |
| 7,153,725 B2 * | 12/2006 | Wang et al. | 438/122 |
| 7,301,222 B1 * | 11/2007 | Patwardhan et al. | 257/620 |
| 2001/0009277 A1 | 7/2001 | Gaynes et al. | 257/1 |
| 2003/0034128 A1 | 2/2003 | Matsumura et al. | 156/330.9 |

FOREIGN PATENT DOCUMENTS

| | | |
|---|---|---|
| DE | 10213296 | 10/2003 |
| EP | 1244143 A2 | 9/2002 |
| FR | 2833754 | 12/2001 |

OTHER PUBLICATIONS

International Search Report with Written Opinion, PCT/IB2004/000990, 11 pages.

* cited by examiner

*Primary Examiner*—Scott B Geyer
(74) *Attorney, Agent, or Firm*—Banner & Witcoff, Ltd.

(57) ABSTRACT

A semiconductor package has a substrate (8) and a semiconductor die (2). The substrate (8) includes a plurality of contact pads (9) on its upper surface and a second plurality of external contact areas (10) on its bottom surface. The semiconductor die (2) includes an active surface with a plurality of die contact pads (3) electrically connected by conducting means (4) to contact pads (9) on the substrate (8) and a layer of first adhesive means (5) on the upper surface (18) of the die (2). Mold material (15) covers the first adhesive means (5), the die (2) and the upper surface of the substrate (8).

6 Claims, 2 Drawing Sheets

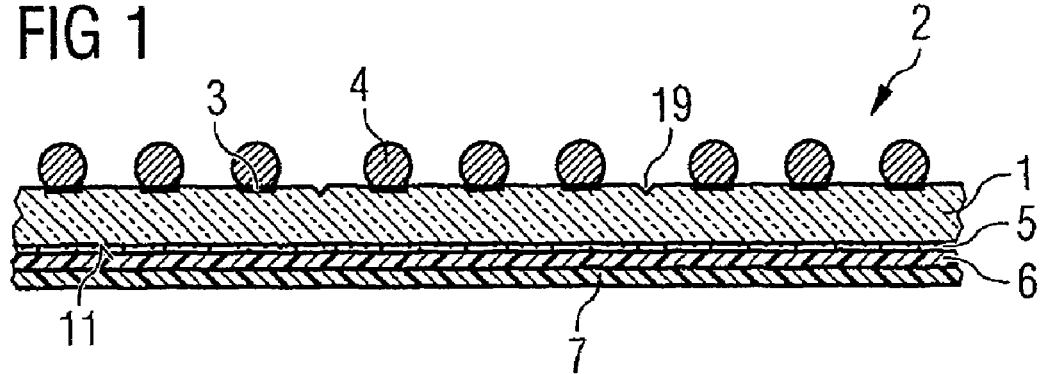
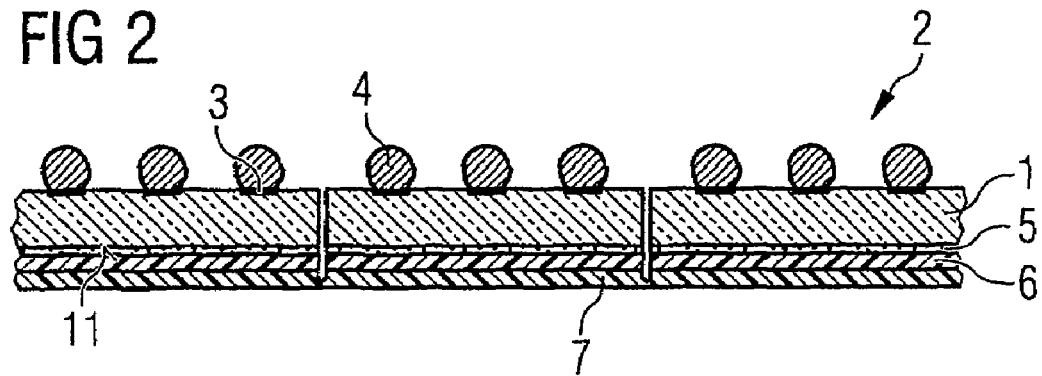
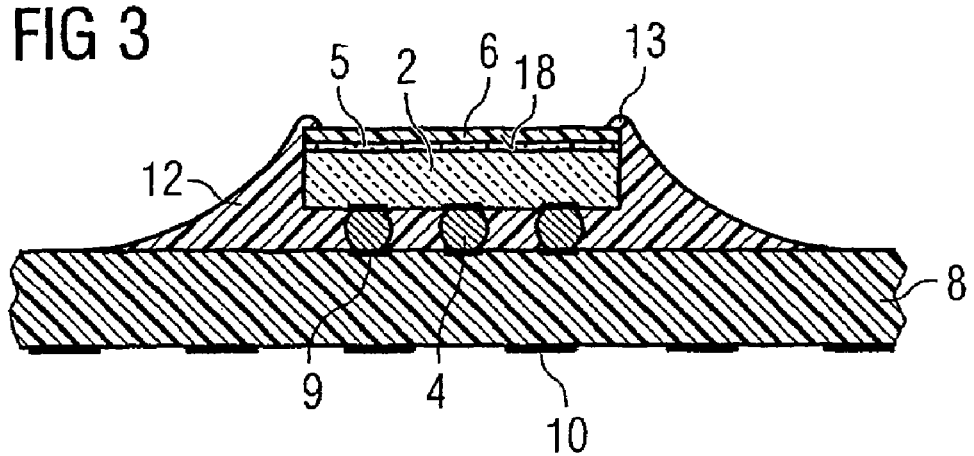

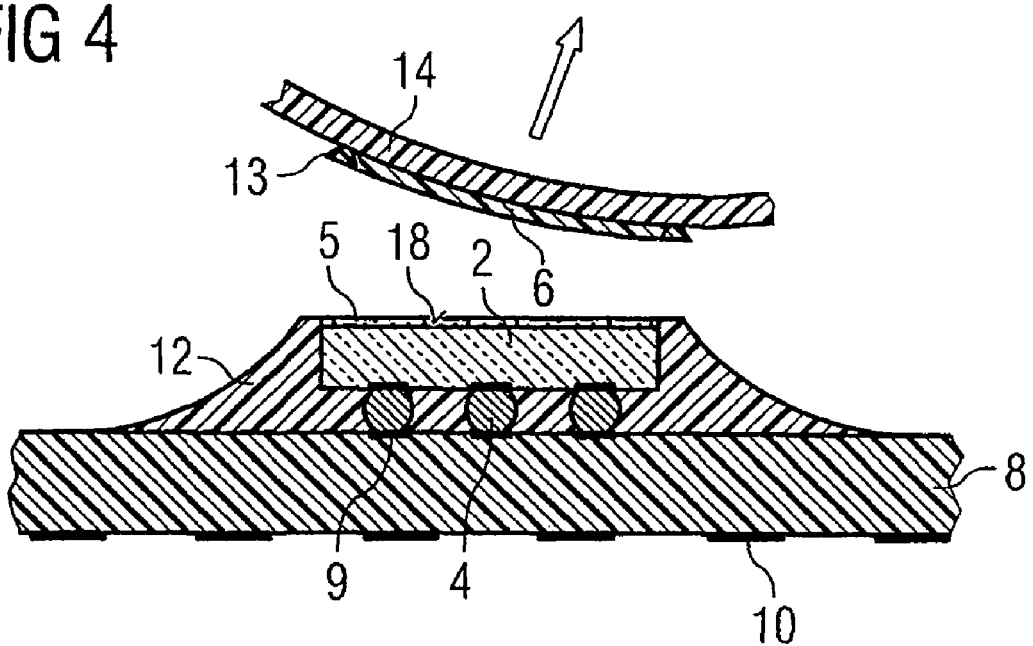
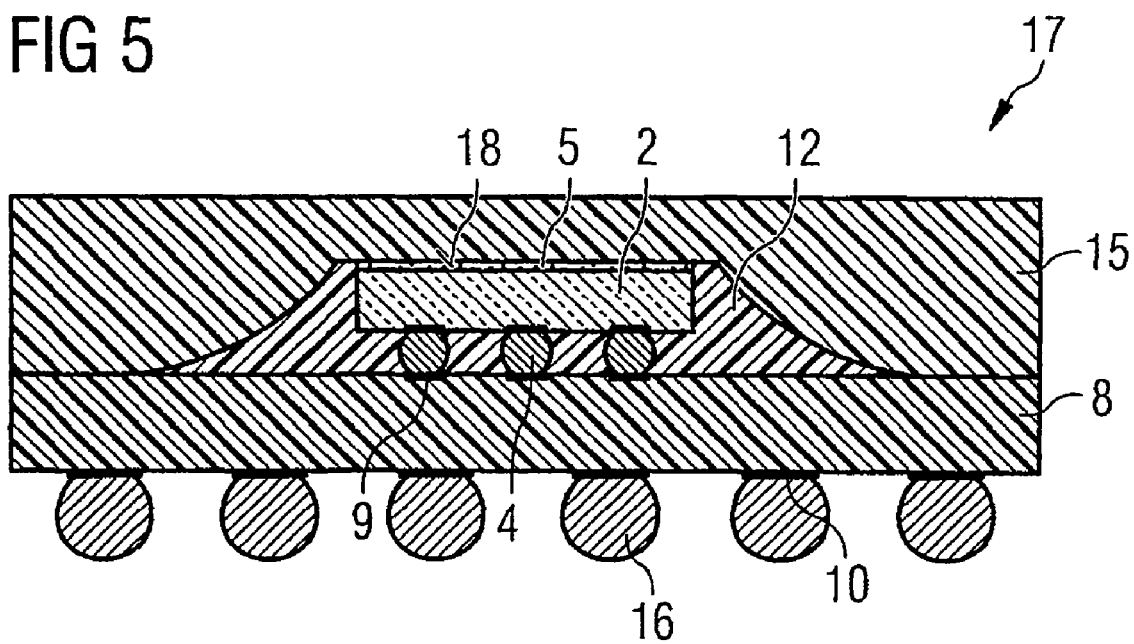

US 7,445,963 B2

SEMICONDUCTOR PACKAGE HAVING AN INTERFACIAL ADHESIVE LAYER

CROSS-REFERENCE TO RELATED APPLICATION

This application is a continuation of co-pending International Application No. PCT/IB2004/000990 filed Mar. 16, 2004 which designates the United States.

TECHNICAL FIELD

The invention relates to a semiconductor package and a method of assembling a semiconductor package.

BACKGROUND

DE 102 13 296 A1 discloses a semiconductor package including a chip mounted using the flip-chip technique to a substrate. The chip is embedded in a plastic molding compound. The reliability and manufacturing yield rate of these packages may be improved.

SUMMARY

A more reliable semiconductor package and a simple cost-effective method for producing the package can be provided by providing a semiconductor wafer which includes a plurality of semiconductor dies and a plurality of sawing streets in its upper surface. Each die may include an active upper surface with a plurality of die contact pads and conducting means such as solder balls or bumps connected to each die contact pad.

A layer of first adhesive means can be attached to the back side of the wafer, a release film to tape or foil can be attached to the first adhesive means and a wafer sawing base tape can be attached to the release film. The dies can then be separated from the wafer by cutting through the wafer from the upper surface using the sawing streets included in the upper surface of the wafer to guide the saw. The layer of first adhesive means and the release film can be cut during this process so that each separated die includes an individual layer of first adhesive means and a release film. All of the dies are still attached to the wafer sawing base tape.

A substrate, such as a redistribution board, can be provided which includes a plurality of contact pads on its upper surface and a second plurality of external contact areas on its bottom surface which are electrically connected by conducting traces on the upper and lower surface and conducting vias.

The die can be removed from the wafer sawing base tape and mounted onto the substrate with its active surface facing the substrate so that the solder bumps are attached to the upper contact areas. The die can then be underfilled by underfill material. The release film is then removed from the adhesive layer on top of the upper side of the die. The adhesive layer, die and the upper surface of the substrate by mold material which comprises materials known in the art, such as plastic.

BRIEF DESCRIPTION OF THE DRAWINGS

Embodiments of the invention will now be described by way of example with reference to the drawings.

FIG. 1 shows a semiconductor wafer including a plurality of dies and tapes on the back side of the wafer, FIG. 2 shows the separating of the dies from the wafer of FIG. 1, FIG. 3 shows the mounting and underfilling of a die of FIG. 2 on a substrate, FIG. 4 shows the removal of the release film from the die of FIG. 3, FIG. 5 shows the encapsulation of the die of FIG. 4 and attachment of external connections to form a semiconductor package.

DETAILED DESCRIPTION

Preferably, the die may be removed from the wafer sawing tape leaving the first adhesive means attached to the upper side of the die and the release film attached to the first adhesive means. Advantageously, the release tape can then act as a protective layer during the underfill process step. Excess underfill material may spilt or overflow onto the release film which forms the outer surface of the upper surface of the die during this stage of the method. The release film therefore protects the upper surface of the die. This may be advantageous as the excess underfill material is more easily removed from the release film than from the upper surface of the die.

Preferably, the release film can be removed leaving the first adhesive means attached to the upper side of the die. The removal of the release film advantageously leads to the removal of the excess underfill material. More preferably, the release film may be removed by an adhesive-coated de-taping film. This is a simple method and avoids the use of solvents or water to dissolve or loosen the release film. This is advantageous in that the die, layer of first adhesive means and substrate are not damaged by chemical processes.

Alternatively, excess underfill material may be removed from the backside or upper side of the die by plasma etching using a protective template, sandblasting using a protective template, grinding, a dry and wet chemical etch of the backside or upper surface of the die using a protective template or a 2 layer coating, which may be dry or wet, on the upper surface or back side of the die.

The back side of the wafer can preferably be thinned by known methods such as plasma etching or grinding or wet and dry chemical etching. Each process results in a different surface finish on the back side of the wafer, for example, a different surface roughness. In known processes, the mold material and processing conditions are adjusted and optimised for each type of surface finish. Wafers having a different surface finish or surface roughness may be used in the same manufacturing line. The mold process step is re-optimised for each surface finish which is time-consuming and expensive. A non-optimised process leads to delamination of the mold material from the die surface and to failure of the package.

The method according to an embodiment may advantageously leave a layer of first adhesive means attached to the upper surface of the die or interfacial adhesive layer. This may provide a more uniform and homogenous outer surface and provides an outer surface to the die which has an improved interfacial adhesion or bonding to the mold compound. The reliability and performance of the packages made using the method according to an embodiment are therefore improved. The yield rate of the manufacturing process is also improved. The manufacturing of packages is simplified in that the mold process can be used for wafers thinned using different methods. Optimisation of the properties of the mold compound to different surface finish on different wafers is avoided.

An intermediate assembly according to the method according to an embodiment comprises a substrate and a semiconductor die. The substrate, such as a redistribution board, comprises a plurality of contact pads on its upper surface and a second plurality of external contact areas on its bottom surface. The semiconductor die includes an active surface with a plurality of die contact pads electrically connected by conducting means to contact pads on the substrate.

The intermediate assembly also includes a layer of first adhesive means attached to the upper side of the die and a release film attached to the first adhesive means.

A semiconductor package may comprise a substrate and a semiconductor die. The substrate, such as a redistribution board, comprises a plurality of contact pads on its upper surface and a second plurality of external contact areas on its bottom surface. The semiconductor die includes an active surface with a plurality of die contact pads electrically connected by conducting means to contact pads on the substrate. A layer of first adhesive means covers the upper surface of the die. Mold material covering the double-sided adhesive, die and upper surface of the substrate.

The layer of first adhesive attached to the upper surface of the die in the semiconductor package according to an embodiment may be advantageous. It provides an interfacial adhesive layer and improved interfacial adhesion or bonding between the die and the mold material and reduces the difference in thermal expansion coefficient between the material of the semiconductor die and the mold material.

Preferably, the first adhesive can be a double-sided adhesive and the release film is non-adhesive. The first adhesive preferably may comprise a double-sided adhesive foil or tape or film. Alternatively, the first adhesive comprises a flexible adhesive means or semi-solid paste or a fluid form. The first adhesive therefore has good adhesion to the upper surface of the die and also provides an adhesive surface so that the release film adheres to the first layer. More preferably, the first adhesive may comprise silica filled rubber, acrylic, polyurethane or epoxy resin and the release film comprises polyester, polyolefin or a polymer.

The die preferably may comprise a thickness of approximately 25 µm to approximately 800 µm or preferably approximately 50 µm to approximately 400 µm or even more preferably approximately 50 µm to approximately 200 µm. A thin die can be advantageous in that the size of the semiconductor package is reduced leading to a desired miniaturization.

The layer of first adhesive means preferably may comprise a thickness of approximately 1 µm to approximately 200 µm or more preferably approximately 2 µm to approximately 100 µm or even more preferably approximately 5 µm to approximately 50 µm. The thickness and properties of the layer of the first adhesive means is adjusted to provide a uniform and homogeneous outer surface and improved matching of the thermal expansion coefficient of the semiconductor and mold material.

The use of the release tape in the method according to an embodiment may be very advantageous. It provides a protective layer so that excess underfill material does not come into contact with the upper surface of the adhesive layer which form the outer surface of the die. The release tape is easily removed using an adhesive-coated de-taping film so that the underfill material which is spilt or overflows onto the release film is removed but the layer of first adhesive means remains attached to the die.

The protective layer on the upper surface of the die in the semiconductor package according to an embodiment can be very advantageous. It provides a consistent surface and provides good interfacial adhesion to the mold compound. This reduces delamination between the die and the mold material and improves the adhesion. This enables a simpler manufacturing process in which the processing parameters are more flexible, the yield loss of the manufacturing process is decreased and the reliability of the package improved. The yield loss is in particular improved for thinner die, which have a thickness of less than approximately 200 µm, where the overflow of underfill material onto the upper surface of the die is more likely.

FIG. 1 shows a semiconductor wafer 1 which includes a plurality of semiconductor dies 2 and tapes or films or foils attached to the back side 11 of the wafer 1. Each die 2 includes an active surface with a plurality of die contact pads 3 and microscopic solder bumps 4 connected to the die contact pads 3 and a passive surface. Microscopic is used here to describe solder bumps which are seen with the aid of a microscope. The dies 2 are arranged in a regular array of rows and columns. A plurality of sawing streets 19, which are also arranged in rows and columns, mark the position of each die 2. A layer of adhesive means 5, such as a double-sided comprising silica filled synthesized rubber, is deposited on the back side 11 of the wafer 1. A release film 6 comprising polyester is attached to the double-sided adhesive layer 5. A wafer sawing base tape 7 then is attached to the release film 6.

FIG. 2 shows the next step of the method according to an embodiment. The dies 2 are separated from the wafer 1 using the sawing streets 19 as a guide for the saw. The dies 2 are separated from the wafer 1 by cutting from the sawing streets 19 in the upper surface of the wafer 1 downwards into the wafer 1 and through the double-sided adhesive layer 5 and release film 6 and partly into the wafer sawing base tape 7. The wafer sawing base tape 7 provides a continuous tape onto which all of the separated dies 2 are attached. Each separated or individual die 2 includes an adhesive layer 5 on its upper passive surface and a release film 6 attached to the adhesive layer 5.

FIG. 3 shows the next step of the process in which the separated dies 2 are mounted to a substrate 8 using the flip-chip technique.

The substrate 8, such as a redistribution board, comprises a plurality of upper contact pads 9 on its upper surface and a second plurality of external contact areas 10 on its bottom surface. The substrate 8 also includes conductive traces on its upper and lower surfaces electrically connected by conducting vias (not shown in the figure for clarity) which electrically connect the upper contact pads 9 with the external contact pads 10. The die 2 is removed from the wafer sawing tape 7 and is mounted with its active surface facing the substrate 8 so that the microscopic solder bumps 4 are attached to the upper contact areas 9 on the substrate. The microscopic solder bumps 4 form an electrical contact between the die 2 and the substrate 8. The passive surface of the die faces upwards away from the substrate 8.

After the die 2 has been removed from the wafer sawing tape 7 and mounted onto the substrate 8, the double-sided adhesive 5 remains attached to the upper side 18 of the die 2 and the release film 6 remains attached to the double-sided adhesive 5.

The area between the active surface of the die 2 and the substrate 8 is underfilled with underfill material 12 so that the microscopic solder bumps 4 and sides of the die 2 are covered with the underfill material 12. During this process some excess underfill 13 spills over onto the upper surface of the release film 6 attached to the adhesive layer 5 on the upper side 18 of the die 2.

FIG. 4 shows the next step of the process during which the excess underfill 13 is removed from the upper side 18 of the die 2 using a de-taping film 14 comprising adhesive coated polyolefin. The adhesive coating of the de-taping film 14 is attached to the release film 6 which is attached to the adhesive layer 5 on the upper surface 18 of the die 2. The de-taping film 14 is removed, thereby removing the release film 6 from the upper surface of the die 2 and any excess underfill material 13 which spilt onto the release film 6. The double-sided adhesive 5 remains attached to the upper passive surface 18 of the die 2.

FIG. 5 shows the next stage of the method to form a semiconductor package 17 according to an embodiment. The layer of double-sided adhesive 5 on the upper surface 18 of the die 2 and the upper surface of the substrate 8 is encapsulated by mold material 15. External conducting means, such as solder balls, 16 are attached to the external contact areas 10 on the bottom surface of the substrate 8. The solder balls 16 provide the electrical connection between the package 17 and an external substrate such as a printed circuit board (not shown in the Figure for clarity).

The semiconductor package 17 assembled using the method according to an embodiment and shown in FIG. 5 comprises a substrate 8 and a semiconductor die 2. The substrate 8 comprises a redistribution board and includes a plurality of contact pads 9 on its upper surface and a second plurality of external contact areas 10 on its bottom surface. The semiconductor die 2 includes an active surface with a plurality of die contact pads 3 electrically connected by conducting means 4 to contact pads 9 on the substrate 8. The upper surface of the die 2 is covered by a layer of double-sided adhesive 5 or interfacial adhesive layer. The upper side 18 of the die and the upper surface of the substrate 3 are covered by mold material 15. Solder balls 16 are attached to the external contact areas 10 on the bottom surface of the substrate 8.

The semiconductor packages 17 are then tested, packaged and mounted on an external circuit such as a printed circuit board.

REFERENCE NUMBERS 1 wafer
2 die
3 die contact pad
4 microscopic solder bump
5 double-sided adhesive
6 release film
7 wafer sawing base tape
8 substrate
9 upper contact areas
10 external contact areas
11 back side of wafer
12 epoxy underfill
13 excess underfill
14 de-taping film
15 mold material
16 solder balls
17 semiconductor package
18 upper side of die
19 sawing street

What is claimed is:

1. A method to assemble a semiconductor package comprising the following steps:
    providing a wafer including a plurality of semiconductor dies, each including an active surface with a plurality of die contact pads and a plurality of conducting means attached to the die contact pads,
    attaching a layer of first adhesive means on the back side of the wafer,
    attaching a release film to the first adhesive means,
    attaching a wafer sawing base tape to the release film,
    separating the dies from the wafer,
    removing the dies from the wafer sawing tape,
    providing a substrate comprising a plurality of contact pads on its upper surface and a second plurality of external contact areas on its bottom surface,
    mounting the die onto the substrate with its active surface facing the substrate so that the conducting means are attached to the upper contact areas,
    underfilling the die,
    removing the release film, and
    encapsulating the upper side of the die and the upper surface of the substrate by mold material.

2. A method to assemble a semiconductor package according to claim 1, wherein the wafer sawing tape is removed leaving the first adhesive means (5) attached to the upper side of the die and the release film attached to the first adhesive means.

3. A method to assemble a semiconductor package according to claim 1, wherein the release film is removed leaving the first adhesive means attached to the upper side of the die.

4. A method to assemble a semiconductor package according to claim 1, wherein the release film is removed by a de-taping film.

5. A method to assemble a semiconductor package according to claim 1, wherein excess underfill material is removed from the upper side of the die by removing the release film or plasma etching with a protective template or sandblasting with a protective template or grinding or dry and wet chemical etching with a protective template or 2 layer dry or wet coating on the back side of the die.

6. A method to assemble a semiconductor package according to claim 1, wherein the back side of the wafer is thinned by plasma etching or grinding or wet and dry chemical etching.

* * * * *